United States Patent [19]
Martin et al.

[11] 4,426,707
[45] Jan. 17, 1984

[54] SINGLE MODE CAVITY LASER

[75] Inventors: Danny W. Martin, St. Charles; Joseph L. Levy, University City, both of Mo.

[73] Assignee: McDonnell Douglas Corporation, Long Beach, Calif.

[21] Appl. No.: 319,196

[22] Filed: Nov. 9, 1981

[51] Int. Cl.³ .............................................. H01S 3/08
[52] U.S. Cl. ...................................... 372/95; 372/98; 372/101; 372/97; 372/108
[58] Field of Search ...................... 372/95, 98, 99, 97, 372/92, 108, 50, 101

[56] References Cited

U.S. PATENT DOCUMENTS

| | | | |
|---|---|---|---|
| 3,835,415 | 9/1974 | Rutz et al. | 372/101 |
| 3,875,532 | 4/1975 | Kobayashi et al. | 372/92 |
| 4,246,548 | 1/1981 | Rutz | 372/101 |

Primary Examiner—William L. Sikes
Assistant Examiner—Léon Scott, Jr.
Attorney, Agent, or Firm—Gregory A. Cone; George W. Finch; Donald L. Royer

[57] ABSTRACT

This external cavity laser utilizes an unstable resonator in conjunction with a high reflectivity stripe end mirror which is oriented substantially parallel to the plane of the maximum divergence of the laser diode output beam and whose axis is substantially parallel to the plane of the junction of the laser diode. This configuration operates with high efficiency to select only the fundamental mode of the laser diode with a minimal divergence in the output beam.

11 Claims, 4 Drawing Figures

SINGLE MODE CAVITY LASER

BACKGROUND OF THE INVENTION

The government has rights to this invention pursuant to contract F33615-76-C-1002 awarded by the Dept. of the Air Force.

FIELD OF THE INVENTION

This invention concerns semiconductor laser diodes. Still more particularly, this invention concerns an external cavity laser configuration which employs an unstable resonator wherein the output end mirror is a flat high reflectivity stripe.

DESCRIPTION OF THE PRIOR ART

Semiconductor injection laser diodes have found a variety of applications since their discovery in the early 1960's. Probably the most important application of these injection lasers is in the context of communication systems. However, important usage is also found in the reprographic industry as well. The gallium arsenide family of semiconductor injection lasers is the most widely used type of injection laser diode at present. They are especially useful because of their small size, high efficiency, and high power infrared output. However, these gallium arsenide laser diodes are plagued with multimode outputs. Unfortunately, a multimode laser will not transmit over any great distance, because the modes of the laser output are not spacially coherent. This results in a transmitted beam which has holes in its far field pattern combined with a large beam divergence, both of which combine to make long distance communication difficult. An ideal injection laser diode beam is one which possesses a single mode output with a near gaussian profile.

A number of different solutions to the multimode output problem have been proposed. One solution is to limit the charge carrier injection into the active region of the laser diode to an extent such that the output is constrained to a small enough level that the oscillations of the higher transverse modes are suppressed. However, this unacceptably reduces the output power of the diode. Additionally, high power diodes require wide junctions, which support higher order modes. Another solution is to place the injection laser diode into a larger external resonator system which is designed to limit the oscillation of the laser output to the fundamental transverse mode without significantly reducing the strength of the output signal. Rutz in U.S. Pat. No. 4,246,548, proposes an external resonating cavity formed of spherical lenses and plane mirrors wherein a spacial filter having one or more slits of predetermined width selects the fundamental mode for the system. Another system is that proposed by Olds in West German Pat. No. 2,365,130. This reference in FIG. 3 at page 22 discloses a laser diode external cavity system which bears certain resemblances to the system of the present invention. However, two significant dissimilarities are immediately apparent. First, the relative positions of the various components of the reference system are immutably fixed relative to each other and, therefore, impossible to adjust to achieve the optimal tuning of the system. Second, the reflecting stripe end mirror, labled 127' in the reference FIG. 3, is specified as being an 80% reflectivity mirror. By contrast, the configuration of the present invention allows for movement of at least one of the components of the system thereby imparting an adjustability and tunability capability to the system which is not present in the reference. Also, the present invention utilizes a reflecting stripe end mirror which is approximately 100% reflective. This difference in the reflectivities of the two end stripe mirrors is significant, because in the reference device, the coherent light output of the system is transmitted out through the mirror itself, while in the system of the present invention, the coherent light output of the system is, rather, transmitted around the stripe end mirror by diffraction coupling, an entirely different mechanism.

Still another configuration useful in achieving single mode output from a gallium arsenide injection laser diode system is found in the IBM Technical Disclosure Bulletin, Vol. 15, No. 2, July, 1972 at page 548-9. This system discloses a gallium arsenide CW laser source in conjunction with a lens and an appropriately tilted diffraction grating which acts to select the fundamental mode of the system.

Diffraction coupling has been used also in other laser systems such as high gain gas and crystal lasers which obtain high power fundamental mode operation with unstable resonators. See, for example, *Gas Laser Technology*, D. Sinclair and W. Bell, Holt Rinehart and Winston, Inc., 1969, at pp. 95-96. This technology, however, is not readily transferrable to the field of semiconductor injection diode lasers.

SUMMARY OF THE INVENTION

The laser system of this invention is an external cavity laser which uses an unstable resonator in conjunction with a high reflectivity end stripe mirror. The gain medium is a semiconductor injection laser diode, most commonly a gallium arsenide laser diode. The fundamental mode of the system is selected by the intracavity lens and the high reflectivity stripe and mirror. The end mirrors of the resonator comprise the back facet of the laser diode, which is high reflectivity coated, and the high reflectivity stripe end mirror. The resonators unstable characteristic allows light to be extracted from the resonator by diffraction coupling, with the high reflectivity end stripe mirror reflecting a portion of the light back into the gain medium laser diode, with the remainder of the light leaking around the edge of the end stripe mirror into the far field as the output of the system.

DETAILED DESCRIPTION OF THE INVENTION

Figure 4:
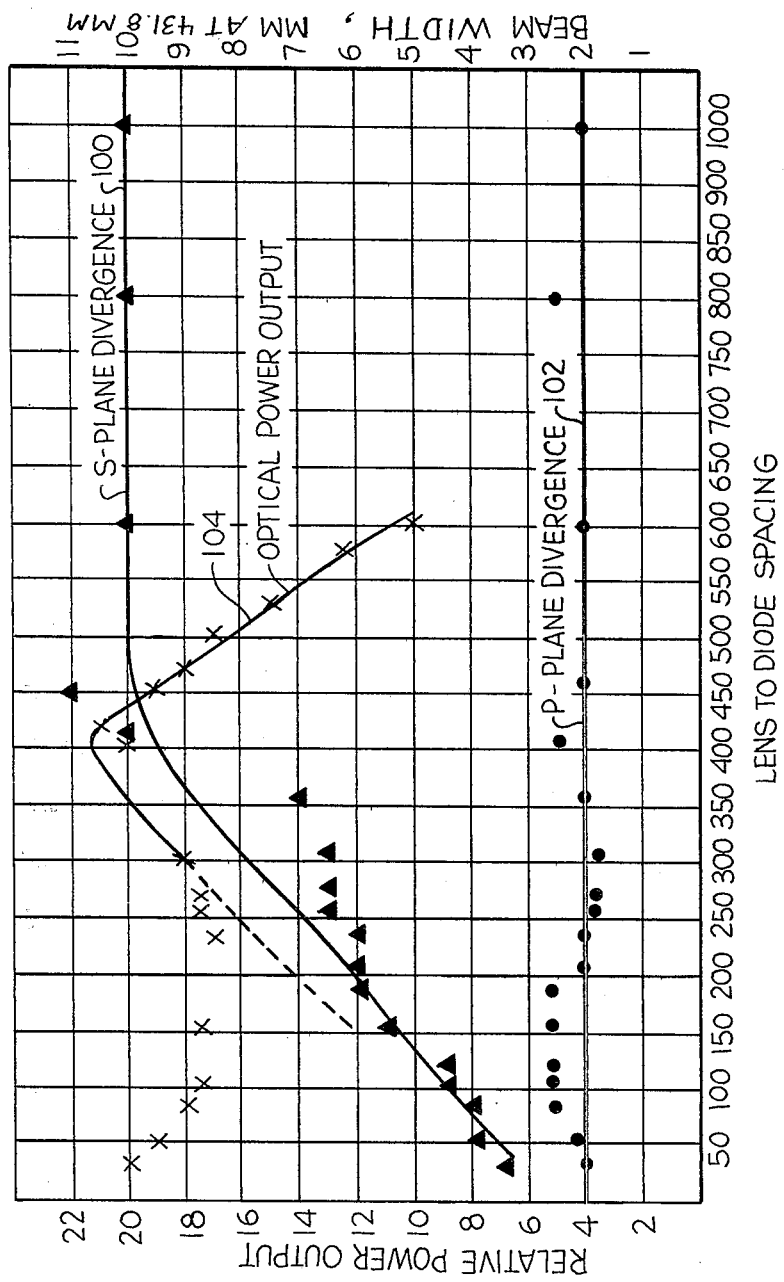
FIG. 4 is a graph showing optical power output and beam divergence as a function of lens to diode spacing.

As mentioned above, present high power semiconductor injection laser diodes, specifically gallium arsenide type double heterostructure and single heterostructure diodes all suffer from multimode outputs. The laser system of this invention selects the fundamental mode of the laser diode gain medium, yet retains 70% of the total power output of the gain medium operated in a multimode fashion. Additionally, all high power injection laser diodes, both CW and pulsed, suffer from very large beam divergence in the plane normal to the PN junction of the laser diode. The beam divergence measured in the plane normal to the junction commonly runs from about 45° to about 60°. The system of this invention utilizing the external cavity laser with unstable resonator and end stripe mirror has a maximum beam divergence of about 3° in the plane normal to the junction, and about 0.3° in the plane of the junction. This is a significant improvement over the prior art which would allow an external cylindrical lens to form a circular fundamental diffraction limited beam. Additionally, this system employs adjustability such that the cavity length may be varied, resulting in relative ease in alignment and control over the amount of beam width at 431.8 millimeters. This adjustability is seen in the graph of FIG. 4. The divergence in the S-plane is depicted by curve 100, the divergence in the P-plane is depicted by curve 102, and the optical power output is depicted by curve 104. The horizontal axis shows the spacing between the lens and the diode in microns corresponding to dimension 42 in FIG. 2. The left vertical axis corresponds to the relative power output as a function of the lens to diode spacing (curve 104). The right vertical axis corresponds to the beam divergence in millimeters measured at a distance of 431.8 mm as a function of the lens to diode spacing (curves 100 and 102). These curves are for a constant lens to mirror spacing (dimension 44 of FIG. 2) of approximately 44 millimeters using 62X Apochromat lens with a numerical aperture of 0.95.

Figure 1:
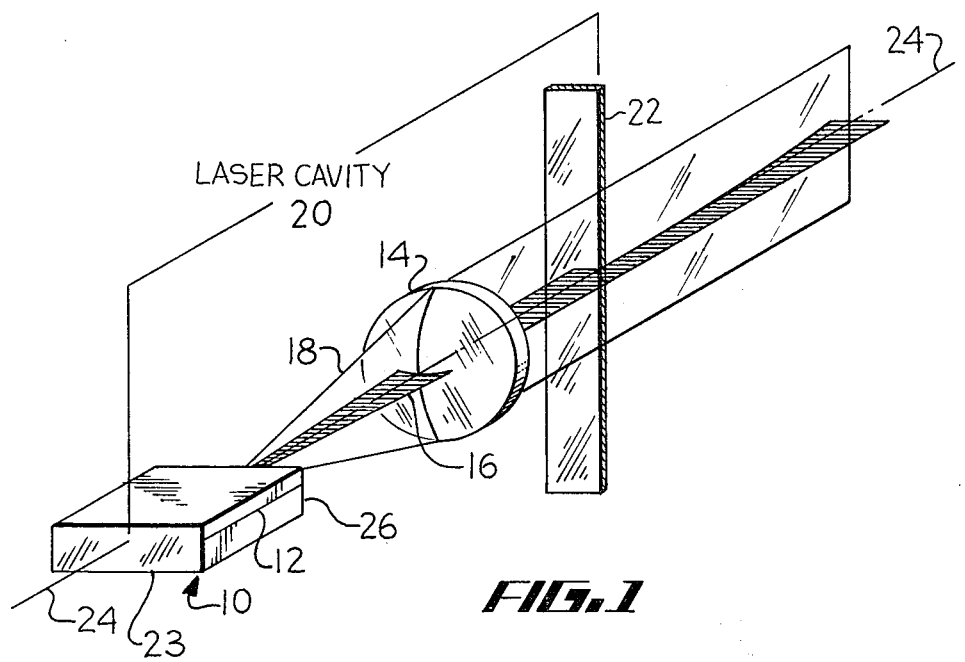
FIG. 1 is an isometric view of the components of the system.

Referring now to FIG. 1, the laser cavity 20 is defined by the stripe end mirror 22 at the output end of the system and the high reflection coating 23 at the back end of the gallium arsenide injection laser diode 10. Suitable charge carrier injection into the PN junction 12 of the laser diode causes stimulated emission of photons in the junction which are transmitted out through the front facet of the laser diode which is covered by an antireflection coating 26 having a reflectivity of about 0.25% or less. The output beam from the laser diode, as noted above, is characterized by wide beam divergence in the plane 18 normal to the plane of the PN junction. The beam divergence in the plane of the PN junction 16 is not as severe, but is still significant. This divergent output beam is then focused by means of the intracavity lens 14 which also employs an antireflection coating on the surface of the lens facing the laser diode. The intracavity lens comprises a multi-element lens system with a typical magnification of 50 to 60 times with a numerical aperature of from about 0.85 to about 0.95. An antireflectivity-coated graded index Selfoc lens, from the Nippon Selfoc Company, Limited, Tokyo, Japan, has produced good results. The intracavity lens 14 acts to collimate the output beam from the laser along the optical axis 24 of the system until it reaches the high reflectivity stripe end mirror 22. The width of this mirror is selected such that only the fundamental mode of the system will be fed back into the laser cavity. The output of the system to the far field comes from the leaking of the output beam around the edge of the mirror by diffraction coupling, a characteristic of unstable resonators. The unstable resonator configuration of this system allows for this diffraction coupling effect. Additionally, the spacing from the lens 14 to the diode end mirror 23 may be varied, allowing for adjustment of the output divergence of the system. As noted above, this system is capable of minimizing the output beam divergence to about 3° in the plane normal to the junction and 0.3° in the plane of the junction about the optical axis of the system. The stripe end mirror has been satisfactorily fabricated from a gold stripe having a reflectivity of greater than 99%. It is significant to note that the stripe end mirror is offset from the optical axis such that one longitudinal edge of the end mirror is substantially adjacent to the axis of the system 24. Also note that the longitudinal axis of the stripe end mirror is substantially parallel to the plane of the maximum beam divergence 18 of the output beam.

Figure 2:
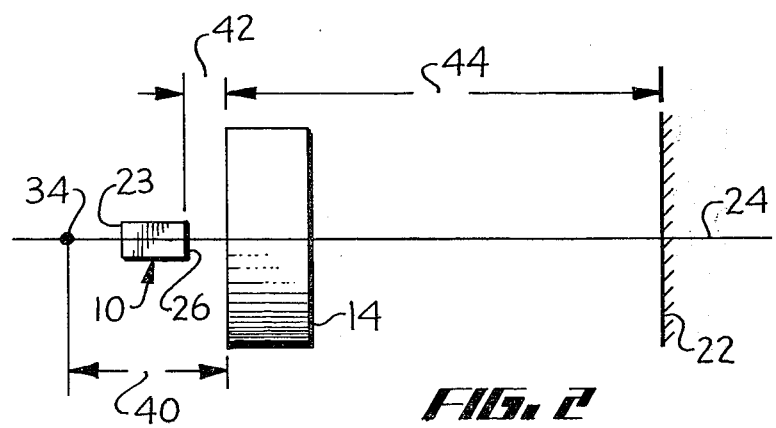
FIG. 2 is a side view of the system.

FIG. 2 shows a side view of the system of this invention. Again, the laser cavity is defined by the mirrored surfaces at the back facet 23 of the laser diode 10 and the end stripe mirror 22. The intracavity lens 14 is located within the laser cavity and has a front focus at point 34 and a front focal length defined by the dimension 40. The relative positions of the various components are defined by the dimensions 42 and 44 which show respectively the spacing between the laser diode and the intracavity lens, and the intracavity lens and the end stripe mirror. For this system which operated at 904 NM, suitable values for dimension 42 range from 400 to 500 microns, and for dimension 44 from 10 to 50 millimeters. The length of the end stripe mirror, measured along its longitudinal axis, is very large compared to its width. In one embodiment this length was about 1.0 cm.

Figure 3:
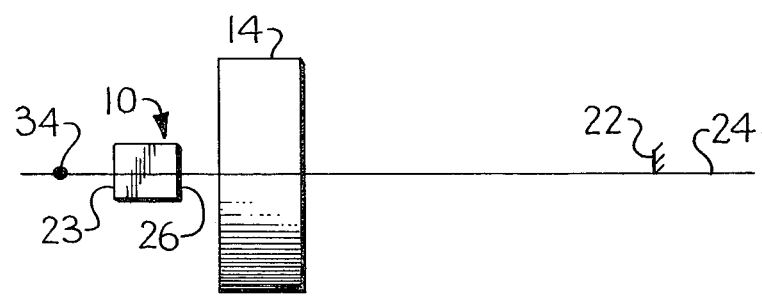
FIG. 3 is a top view of the system.

FIG. 3 is a top view of the system of this invention showing the laser diode 10, the intracavity lens 14, the front focus point 34 of the intracavity lens, the end stripe mirror 22, and the optical axis of the system 24. The small width of the end stripe mirror 22 is evident in this view. This width acts to select the fundamental output mode for the system and may be varied depending upon the desired mode and the wavelength of the light. In one embodiment this was varied in the range of from about 0.05 mm to about 0.8 mm.

The system of this invention has several important advantages over the prior art. The resonator used for the external cavity laser system is unstable and is, therefore, not as sensitive to alignment as are most external cavity lasers. Such prior art external cavity lasers commonly employ stable resonator configurations of the cats eye and hemiconfocal as well as various other types. The end stripe or output mirror, which in one embodiment is a gold stripe, is positioned perpendicular to the plane of the junction of the diode and acts to select the fundamental mode. No, or very little, feedback is obtained for the higher order modes of the gain medium because the stripe width is matched to the fundamental mode. The output of the external cavity laser employing the unstable resonator configuration with the end stripe mirror is the product of an off-axis end mirror which allows a single mode to leak past one side of the stripe mirror into the far field.

We claim:

1. An external cavity laser system comprising:
   means for generating a beam of coherent light comprising a laser diode gain medium having a high reflectivity back surface;
   an intracavity lens; and,
   an off-axis stripe end mirror such that the longitudinal axis of said mirror is oriented substantially parallel to the plane of said maximum divergence of a beam and one of said mirror edges is disposed adjacent to the optical axis of the system,
   such that the system forms an unstable resonator cavity.

2. The system of claim 1 wherein the laser diode comprises a gallium arsenide laser diode.

3. The system of claim 1 wherein the reflectivity of the back surface of the gain medium is at least 99%.

4. The system of claim 1 wherein the reflectivity of the front surface of the gain medium is less than about 0.25%.

5. The system of claim 1 wherein the intracavity lens comprises a multi-element lens having a magnification of from about 50 to about 60 times, and a numerical aperture of from about 0.85 to about 0.95.

6. The system of claim 1 wherein the surfaces of the lens have a reflectivity of less than about 0.25%.

7. The system of claim 1 wherein the width of the stripe end mirror is matched to the fundamental transverse mode of the system such that no higher order modes are fed back into the gain medium at an effective level.

8. The system of claim 1 wherein the reflectivity of the stripe end mirror is at least 99%.

9. The system of claim 1 wherein the stripe end mirror comprises a gold stripe with a reflectivity of greater than 99%.

10. The system of claim 1 further comprising means for varying the distance between the gain medium and the lens.

11. The system of claim 1 further comprising means for varying the distance between the lens and the mirror.

* * * * *

UNITED STATES PATENT AND TRADEMARK OFFICE
CERTIFICATE OF CORRECTION

PATENT NO. : 4,426,707

DATED : January 17, 1984

INVENTOR(S) : Danny W. Martin, et al.

It is certified that error appears in the above-identified patent and that said Letters Patent is hereby corrected as shown below:

Column 4, line 62, "a" should be --said--.

Signed and Sealed this

Nineteenth Day of March 1985

[SEAL]

Attest:

DONALD J. QUIGG

Attesting Officer

Acting Commissioner of Patents and Trademarks